(12) United States Patent
Furumiya et al.

(10) Patent No.: US 6,639,293 B2
(45) Date of Patent: Oct. 28, 2003

(54) SOLID-STATE IMAGING DEVICE

(75) Inventors: Masayuki Furumiya, Tokyo (JP);
Hiroaki Ohkubo, Tokyo (JP);
Yasutaka Nakashiba, Tokyo (JP)

(73) Assignee: NEC Electronics Corporation,
Kanagawa (JP)

( * ) Notice: Subject to any disclaimer, the term of this patent is extended or adjusted under 35 U.S.C. 154(b) by 0 days.

(21) Appl. No.: 09/996,703

(22) Filed: Nov. 30, 2001

(65) Prior Publication Data

US 2002/0063302 A1 May 30, 2002

(30) Foreign Application Priority Data

Nov. 30, 2000 (JP) ......................... 2000-365525

(51) Int. Cl.$^7$ ................. H01L 31/036; H01L 29/74; H01L 27/148; H01L 29/80; H01L 29/768; H01L 31/0288; H01L 31/112; H01L 31/062; H01L 31/116; H01L 29/76; H01L 29/94

(52) U.S. Cl. ............. 257/462; 257/72; 257/225; 257/257; 257/258; 257/232; 257/233; 257/291; 257/292; 257/290; 257/461

(58) Field of Search ................ 257/72, 22, 258, 257/222, 225, 257, 232, 233, 334, 291, 292, 290, 461, 293, 462

(56) References Cited

U.S. PATENT DOCUMENTS 5,598,022 A   1/1997  Kyomasu
5,859,462 A   1/1999  Tredwell et al.
6,133,615 A  10/2000  Guckel et al.

FOREIGN PATENT DOCUMENTS

| DE | 199 08 457 A1 | 9/1999 | |
|---|---|---|---|
| JP | 11-233747 | * 2/1998 | ............. 27/146 |
| JP | 11-233747 | * 8/1999 | ............. 27/146 |
| JP | 2000-32449 | 1/2000 | |
| JP | 2000-91552 | 4/2000 | |
| JP | 2001-7309 | 1/2001 | |
| WO | 94/28582 | 12/1994 | |
| WO | 00/00994 | 1/2000 | |

OTHER PUBLICATIONS

Hon–Sum Philip Wong et al., "CMOS Active Pixel Image Sensors Fabricated Using a 1.8–V, 0.25$\mu$m CMOS Technology," IEEE: Transactions on Electron Devices, V. 45, 1998, pp. 889–894.

* cited by examiner

Primary Examiner—Nathan J. Flynn
Assistant Examiner—Victor A. Mandala, Jr.
(74) Attorney, Agent, or Firm—Young & Thompson (57) ABSTRACT

A solid-state imaging device such as a CMOS image sensor includes photodiode portions that are designed for both improving sensitivity and reducing crosstalk of electrical charge to adjacent pixels. A p-type layer, which has an impurity concentration that is lower than that of a substrate p$^+$-layer, is formed on the substrate p$^+$-layer which is a p-type silicon semiconductor substrate of high impurity concentration. An n-type photoelectric conversion region is provided at a position on the upper side of the p-type layer. By means of this configuration, of the photoelectrons that are generated in the p-type layer, electrons that diffuse in the direction of the substrate are reliably captured in substrate p$^+$-layer and annihilated by recombination.

11 Claims, 9 Drawing Sheets

SOLID-STATE IMAGING DEVICE

BACKGROUND OF THE INVENTION

1. Field of the Invention

The present invention relates to a solid-state imaging device and to a semiconductor photoelectric conversion device having a photoelectric conversion element such as a photodetector of a photocoupler, and more particularly to a solid-state imaging device that is interchangeable in fabricating processes with a CMOS (Complementary Metal-Oxide Semiconductor) device, i.e., a CMOS image sensor.

2. Description of the Related Art

Recent years have seen the development of cameras that are used for acquiring image data and used together with, for example, personal computers (PCs). Charge coupled device (CCD) image sensors that employ CCDs or CMOS image sensors that are interchangeable with CMOS devices in fabrication processes are used as the solid-state imaging devices that are incorporated in these cameras.

A CCD image sensor is a type of image sensor in which photoelectric conversion elements or photodiodes are arranged two-dimensionally corresponding to pixels (picture elements), the signals of respective pixels that have become electric charges by means of photoelectric conversion elements being read sequentially using vertical transmission CCDs and horizontal transmission CCDs. CMOS image sensors are similar to CCD image sensors in that photoelectric conversion elements are arranged two-dimensionally corresponding to pixels, but in reading signals, rather than using vertical and horizontal transmission CCDs, signals stored for respective pixels are read from selected picture elements by means of selection lines constituted by aluminum lines, as in the read-out of a semiconductor memory device.

In contrast with a CCD image sensor, which requires a plurality of positive and negative power source voltages for driving the CCDs, a CMOS image sensor can be driven by a single power supply and enables lower power consumption and lower power source voltage than a CCD image sensor. Furthermore, the use of a fabrication process for the CCD itself in the fabrication of a CCD image sensor complicates the straightforward application of fabrication processes that are typically used for a CMOS circuit. In contrast, the fabrication processes used for a CMOS image sensor are also commonly used for CMOS circuits. Peripheral circuits such as logic circuits, analog circuits and analog/digital conversion circuits can therefore be formed simultaneously with the CMOS image sensor by means of CMOS fabrication processes that are often used in the fabrication of processors, semiconductor memory devices such as DRAMs (Dynamic Random Access Memories), and logic circuits. In other words, a CMOS image sensor has the advantages that it can easily be formed on the same semiconductor chip as semiconductor memory device or a processor, and in addition, the fabrication of the CMOS image sensor can easily share the same manufacturing plant as a semiconductor memory device or processor.

Figure 1:
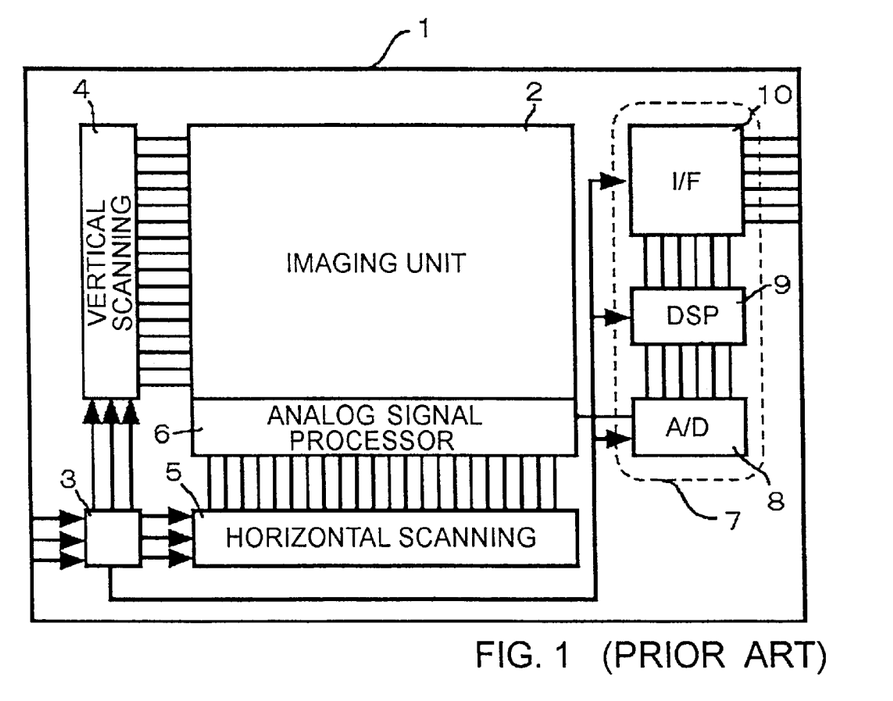
FIG. 1 is a schematic plan view showing the construction of one example of a CMOS image sensor.

FIG. 1 is a schematic plan view showing an example of this type of CMOS image sensor and shows the floor plan of a semiconductor device that is formed as a CMOS image sensor. CMOS image sensor 1 is provided with: imaging unit 2 in which photoelectric conversion elements are arranged two-dimensionally for each pixel; timing generator 3 for generating timing signals that are necessary for reading signals from the pixels; vertical scanning unit 4 and horizontal scanning unit 5 for selecting the output of pixels; analog signal processor 6 for amplifying and processing signals from selected pixels; and logic circuit unit 7 for processing the analog signal output from analog signal processor 6 and outputting the result as digital signals. Logic circuit unit 7 is provided with: A/D converter 8 for performing analog-to-digital conversion of the input analog signals; digital signal processor (DSP) 9 for converting the digitized signals to digital image signals; and interface (I/F) 10 for outputting digital image signals to the outside and receiving command data from the outside.

Figure 2:
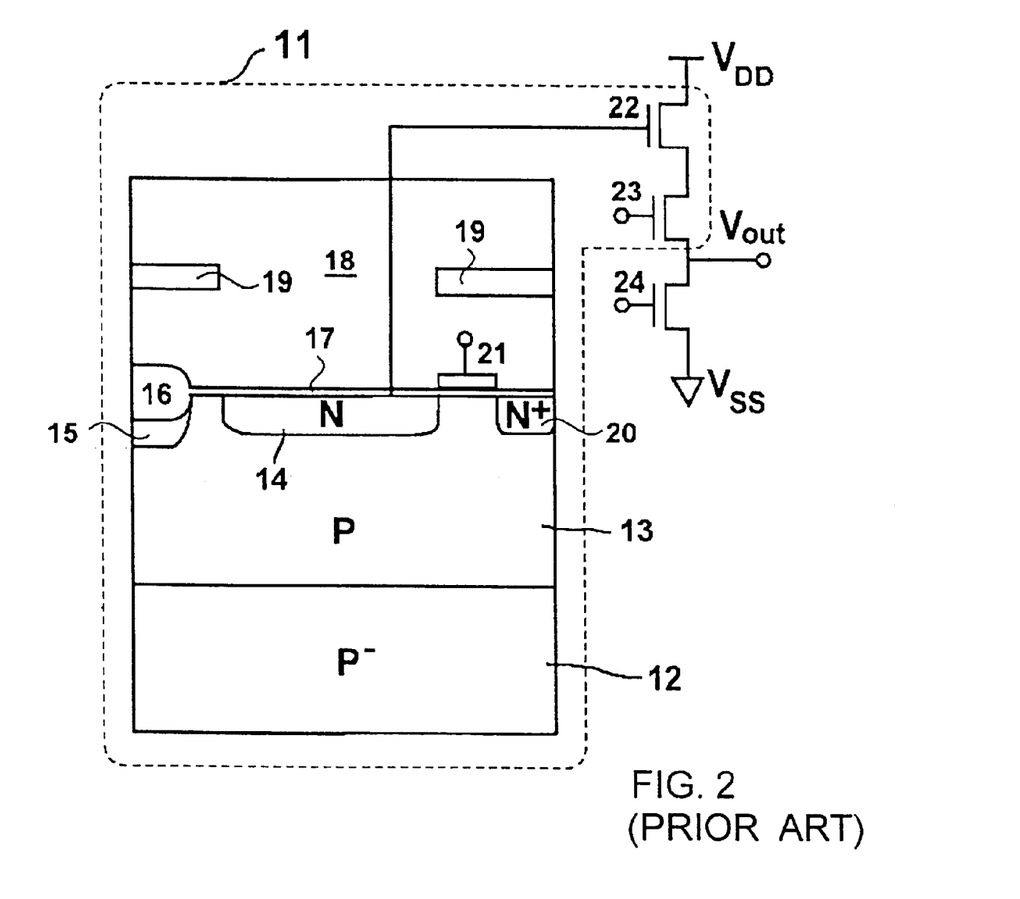
FIG. 2 is a schematic sectional view showing an unit cell and a peripheral circuit in a CMOS image sensor of the prior art.

Explanation next regards the unit cells that make up imaging unit 2 of CMOS image sensor 1. The unit cell in this case is provided for each pixel and is constituted by a photoelectric conversion element, i.e., a photodiode, for each pixel realized by a PN junction, and a transistor that constitutes a switch for selecting this photoelectric conversion element. FIG. 2 is a schematic sectional view showing the construction of an unit cell of the prior art in a CMOS image sensor.

Unit cell 11 has fundamentally a construction in which a p-type well region 13 is provided on $p^-$-type substrate 12, and n-type photoelectric conversion region 14 which joins p-type well region 13 to form a photodiode is provided in the surface of p-type well region 13. For the purpose of isolating this unit cell 11 from adjacent unit cells, there is further provided: $p^+$-type isolation region 15 that is formed in p-type well region 13; isolation oxide film 16 formed on, for example, $p^+$-type isolation region 15; gate oxide film 17 which is formed on portions of the surfaces of p-type well region 13 and n-type photoelectric conversion region 14 other than the region in which isolation oxide film 16 is formed; interlayer insulation film 18 which is formed so as to cover the entire surfaces of isolation oxide film 16 and gate oxide film 17; and shield film 19 which is formed in interlayer insulation film 18 for preventing the incidence of light to unnecessary portions.

In addition, $n^+$-type reset drain region 20 is formed in p-type well region 13 at a position that is somewhat separated from n-type photoelectric conversion region 14. Gate oxide film 17 is also formed on the surface of this $n^+$-type reset drain region 20. Reset transistor 21 is formed which takes the region that is within p-type well region 13 and between n-type photoelectric conversion region 14 and $n^+$-type reset drain region 20 as the channel region, n-type photoelectric conversion region 14 as the source region, and $n^+$-type reset drain region 20 as the drain region. N-type photoelectric conversion region 14 is thus connected to $n^+$-type reset drain region 20 by way of reset transistor 21.

Unit cell 11 is further provided with driver transistor 22 of a source follower, and transistor 23, which is a horizontal selection switch. N-type photoelectric conversion region 14 is connected to the gate of driver transistor 22 for outputting to the outside output changes according to the amount of incident light. Load transistor 24 of a source follower is formed for each row of the unit cell array. Driver transistor 22, transistor 23, and load transistor 24 are inserted in that order in a series between power supply voltages $V_{DD}$ and $V_{SS}$. The voltage output $V_{out}$ of this unit cell 11 is obtained from the connection point between transistor 23 and load transistor 24.

A CMOS image sensor of this construction operates as follows.

First, raising a pulse which is applied to the gate of reset transistor 21 to a high level sets the potential of n-type photoelectric conversion region 14 to the power supply voltage $V_{DD}$ which is applied to n⁺-type reset drain region 20 and thus resets the signal charge in n-type photoelectric conversion region 14. Lowering the pulse which is applied to the gate of reset transistor 21 to a low level brings about the start of accumulation of signal charge. During accumulation of signal charge, the incidence of light generates electron-hole pairs in the region of the lower portion of n-type photoelectric conversion region 14, whereupon the electrons are accumulated in the depletion layer below n-type photoelectric conversion region 14 and the holes are discharged through p-type well region 13. The potential of n-type photoelectric conversion region 14 then changes according to the number of accumulated electrons, and by the operation of the source follower, this change in potential is outputted by way of the source of driver transistor 22 to horizontal selection switch transistor 23, whereby a photoelectric conversion output characteristic having good linearity can be obtained.

Although "kTC" noise occurs in n-type photoelectric conversion region 14, which becomes a floating diffusion layer, when reset transistor 21 is reset, this noise can be eliminated by sampling and storing output during darkness before transmitting signal electrons and then finding the difference between this and bright output. Here, k is Boltzmann's constant, T is temperature, and C is electrical capacitance.

Figure 3:
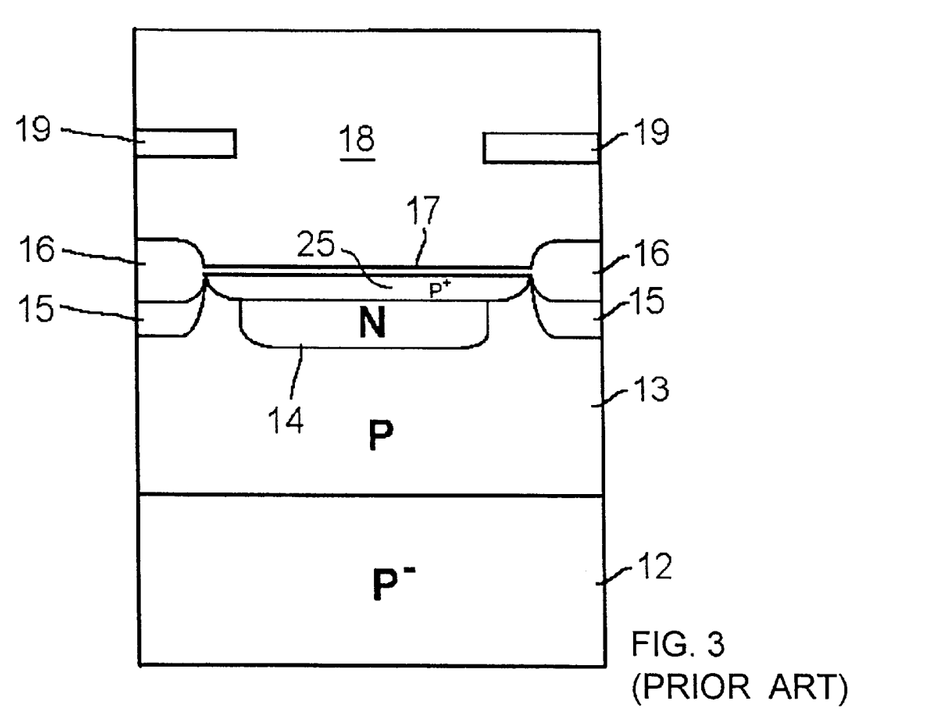
FIG. 3 is a schematic sectional view showing an unit cell of the prior art in which leak noise in a photodiode has been reduced.

FIG. 3 is a schematic sectional view showing the a photodiode structure which provides greater reduction of leak noise than the photoelectric conversion element (photodiode) in the unit cell shown in FIG. 2. In FIG. 3, parts bearing the same reference numerals as parts in FIG. 2 are the same constituent elements as in FIG. 2.

The photodiode structure shown in FIG. 3 includes surface p⁺-layer 25 formed on the surface of the photodiode (i.e., photoelectric conversion element) portion in FIG. 2, and the provision of this type of surface p⁺-layer 25 reduces leak current on the surface of the photodiode portion. This type of construction is well used in the prior art.

Recent years have seen increasing demand for miniaturization as well as demand for greater numbers of pixels in image sensors (i.e., solid-state imaging devices), and these demands have inevitably necessitated both higher integration of the unit cells and smaller area per pixel. A reduction in the size of a pixel results in a reduction in the area of each photodiode, and this reduction in area in turn results in a decrease in the amount of light that is incident to each pixel. The reduction in the amount of incident light has resulted in a drop in output signal, whereby the SN (signal-to-noise) ratio of the output image is degraded and image quality deteriorates.

A solution to these problems calls for an improvement in the photoelectric conversion efficiency per unit area. Since the pixels are smaller, the amount of light that is incident to each pixel also decreases. Regardless of this decrease in the amount of incident light, the photoelectric conversion efficiency in the direction of depth of the photodiode must be improved in order to increase photoelectrons, i.e., a deep photodiode must be formed. Forming a deep photodiode means extending the depletion layer of the photodiode deep into the substrate. In this way, electrons that were generated by photoelectric conversion in the prior art but that flowed in the direction of the substrate and therefore were not accumulated in the photodiode portion and did not contribute to the sensitivity of the photodiode can be efficiently accumulated in the photodiode.

Based on this consideration, the assignees of the present invention have previously proposed in JP, P2001-7309A a method in which the impurity concentration of only the p-type well layer below the photodiode is made lower than the impurity concentration of the p-type well of other portions, thereby extending the depletion layer of the photodiode more deeply into the substrate and improving sensitivity to light, and moreover, reducing capacitive coupling with the substrate to improve detection sensitivity.

However, a problem remains that was not solved by the adoption of these measures. This problem involves the occurrence of crosstalk between pixels and the substantial decrease in resolution due to the movement of electrons between neighboring photodiodes (i.e., unit cells). In other words, the diffusion of photoelectrons in pixels in which light is generated results in the leakage of electrons into pixels in which there should be no incident light to begin with, and noise is thus generated that gives the appearance of signal input even in these pixels in which there is no incident light. Contrivances such as shield films are unable to suppress this crosstalk component because it originates from the generation of photoelectrons in relatively deep portions of the substrate. Light that results in photoelectrons in relatively deep portions of the substrate is light of wavelengths ranging from red to near-infrared. This is because, due to the dependence on wavelength of the absorption coefficient of silicon (Si) which is used as the semiconductor substrate, absorption length is greater for light of the red or near-infrared wavelength region, i.e., this light penetrates deep into the substrate. Photoelectrons that occur deep in the substrate due to the absorption of this light diffuse in the p-type substrate, and photoelectrons that diffuse in the horizontal direction in the sectional view shown in FIG. 2 or FIG. 3 may reach a neighboring pixel and thus become a source of crosstalk.

In contrast, blue and green light, which is visible light of short wavelengths, is substantially absorbed within portions of the n-type photoelectric conversion region and depletion layer of the photodiode that spread in the direction of the substrate, and this light therefore does not penetrate deep into the substrate. In other words, the crosstalk component which passes through the substrate is small for short wavelengths.

If the p-type well is formed to too great a depth, sensitivity with respect to near-infrared light increases and the device is no longer amenable for use as a solid-state imaging device for application to visible light. Infrared (IR) cutoff filters are often used to suppress sensitivity to near-infrared light, but if sensitivity to near-infrared light is too great, sensitivity to light that passes through the filter cannot be ignored regardless of the use of the IR cutoff filter.

Thus, simply increasing the depth of the p-type well to raise sensitivity increases the unwanted sensitivity to near-infrared light, and further, electrons that occur in the deeper portions of the p-type well diffuse horizontally and become a source of crosstalk to neighboring pixels.

In conclusion, a photodiode structure that provides both high sensitivity to visible light and low crosstalk has not yet been proposed.

SUMMARY OF THE INVENTION

It is an object of the present invention to provide a solid-state imaging device that can raise detection sensitivity, raise output conversion efficiency, raise photoelectric conversion efficiency, extend the depletion layer, maintain the isolation characteristics between pixels, and reduce the occurrence of crosstalk.

The object of the present invention is realized by a solid-state imaging device which includes: a substrate layer which is composed of a semiconductor of a first conductive type; a semiconductor layer of the first conductive type which is provided on the substrate layer; and a photoelectric conversion region of a second conductive type, which is the opposite conductive type of the first conductive type, provided on the semiconductor layer; wherein the impurity concentration of the substrate layer is higher than the impurity concentration of the semiconductor layer.

A low-impurity concentration semiconductor layer of the first conductive type having a lower impurity concentration than the semiconductor layer may be provided between the substrate layer and the semiconductor layer. In a case in which the low-impurity concentration semiconductor layer is provided, the impurity concentration of the low-impurity concentration semiconductor layer is preferably lower than the impurity concentration of the photoelectric conversion region.

The solid-state imaging device of the present invention may further be provided with a peripheral circuit semiconductor layer of the first conductive type that has a higher impurity concentration than the semiconductor layer and that is formed on the semiconductor layer at least below transistors in pixels. In addition, from the standpoint of suppressing sensitivity to near-infrared light, the distance from the surface of the main plane of the semiconductor to the surface of the semiconductor layer on the substrate layer side is preferably a minimum of 2 $\mu$m and a maximum of 10 $\mu$m.

In the present invention, at least one of the semiconductor layer and the low-impurity density semiconductor layer is preferably formed by epitaxial growth. Further, the depth profile of the impurity in the semiconductor layer is preferably a retrograde profile.

By adopting the above-described structure, the present invention can realize a photodiode that is capable of high sensitivity, can cause the spectral characteristic to approach the spectral characteristic of visible light, and further, can provide a solid-state imaging device that suppresses crosstalk between pixels.

The above and other objects, features, and advantages of the present invention will become apparent from the following description based on the accompanying drawings which illustrate examples of preferred embodiments of the present invention.

DETAILED DESCRIPTION OF THE INVENTION

Figure 4:
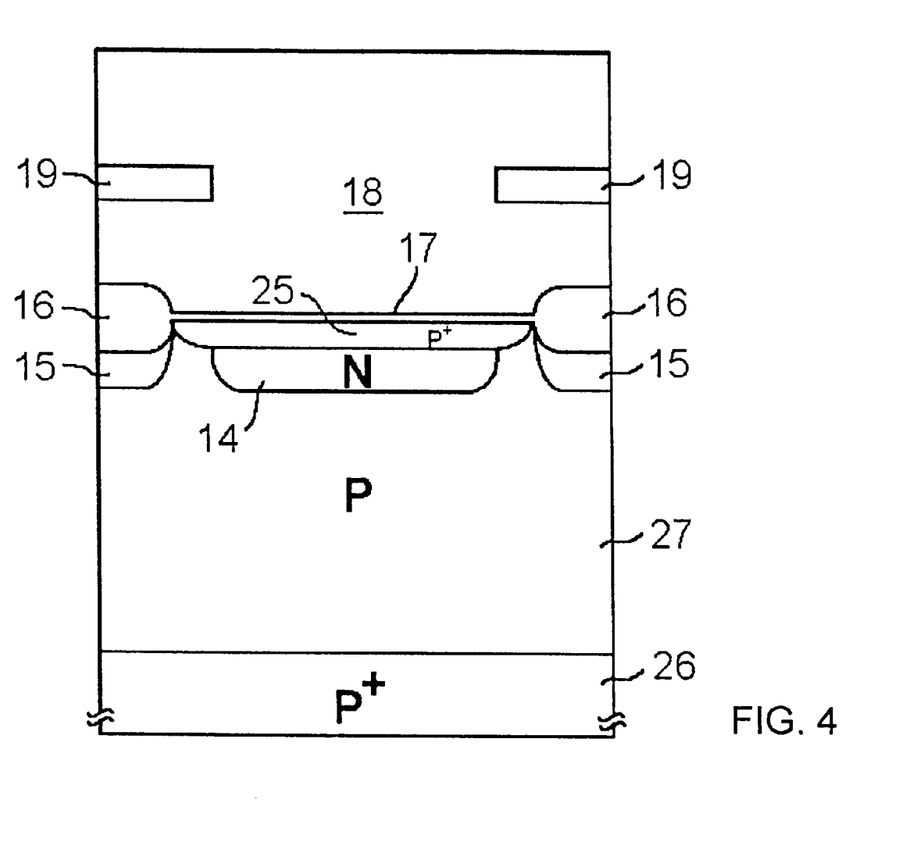
FIG. 4 is a schematic sectional view showing an unit cell in a solid-state imaging device according to a first embodiment of the present invention.

First Embodiment:

A solid-state imaging device whose unit cell is shown in FIG. 4 is formed as the CMOS image sensor of type shown in the above-described FIG. 1. In the solid-state imaging device of FIG. 4, the construction and operation of portions other than the unit cell are equivalent to the CMOS image sensor shown in FIG. 1 and redundant explanation is therefore omitted. In addition, parts in FIG. 4 that have the same reference numerals as parts in FIG. 2 are identical to the constituent elements in FIG. 2.

In FIG. 4, p-type layer 27 having an impurity concentration that is lower than substrate p$^+$-layer 26 is formed on substrate p$^+$-layer 26, which is a high-concentration p-type semiconductor substrate (for example, a silicon p$^+$-type substrate). N-type photoelectric conversion region 14 is formed at a location on the upper side of this p-type layer 27. Substrate p$^+$-layer 26, p-type layer 27, and n-type photoelectric conversion region 14 correspond to the substrate layer of the first conductive type, the semiconductor layer of the first conductive type, and the photoelectric conversion region of the second conductive type, respectively. N-type photoelectric conversion region 14 is formed by, for example, ion implantation or diffusion of an n-type impurity in p-type layer 27. P-type layer 27 is preferably formed on substrate p$^+$-layer 26 by epitaxial growth. The impurity profile may be controlled by ion implantation of a p-type impurity as in the second embodiment to be explained hereinbelow. In this case, the impurity concentration of substrate p$^+$-layer 26 is, for example, $1\times10^{18}$/cm$^3$ to $1\times10^{22}$/cm$^3$, and the impurity concentration of p-type layer 26 is, for example, $1\times10^{16}$/cm$^3$ to $1\times10^{18}$/cm$^3$. The impurity concentration of n-type photoelectric conversion region 14 is, for example, $1\times10^{18}$/cm$^3$ to $1\times10^{22}$/cm$^3$.

P$^+$-type isolation regions 15 and isolation oxide films 16 are provided for device isolation at both ends of the upper surface of p-type layer 27 that is shown in the figure, and in addition, as with the unit cell of the prior art that is shown in FIG. 3, surface p$^+$-layer 25 is formed on the surfaces of p-type layer 27 and n-type photoelectric conversion region 14 other than the formation region of isolation oxide layers 16 to prevent leaks at the surface of the photodiode portion. Interlayer insulation film 18 is provided on isolation oxide films 16 and surface p$^+$-layer 25 so as to cover the entire solid-state imaging device that includes this unit cell. Shield films 19 are formed in interlayer insulation film 18 to prevent the incidence of light to portions that do not require light.

The thickness of p-type layer 27 in this unit cell is set to from approximately 2 $\mu$m to 10 $\mu$m. In other words, the distance from the surface of the semiconductor main plane to the interface between p-type layer 27 and substrate p$^+$-layer 26 is set to a minimum of 2 $\mu$m and a maximum 10 $\mu$m. This range from 2 $\mu$m to 10 $\mu$m is substantially equal to the absorption length of light of the red or near-infrared region in silicon. The thickness of p-type layer 27 can be changed according to the wavelength of light for which sensitivity is required.

When incident light enters a photodiode that is made up by n-type photoelectric conversion region 14 and p-type layer 27, the incidence of light generates electron-hole pairs in n-type photoelectric conversion region 14 and the region of p-type layer 27 that is below n-type photoelectric conversion region 14 during a signal charge accumulation period. The generated electrons are then accumulated in the depletion layer that is formed in n-type photoelectric conversion region 14 and the portion of p-type layer 27 that lies below n-type photoelectric conversion region 14. Because substrate $p^+$-layer 26, which has a higher impurity concentration than p-type layer 27, is arranged below p-type layer 27, electrons of the photoelectrons occurring in p-type layer 27 at this time that diffuse in the direction of the substrate are reliably captured in substrate $p^+$-layer 26, recombined, and annihilated. Electron diffusion in the horizontal direction is therefore more greatly suppressed in the unit cell shown in FIG. 4 than in the unit cell of the prior art. As a result, crosstalk between pixels can be reduced, thereby enabling a suppression of a drop in image resolution.

Figure 5:
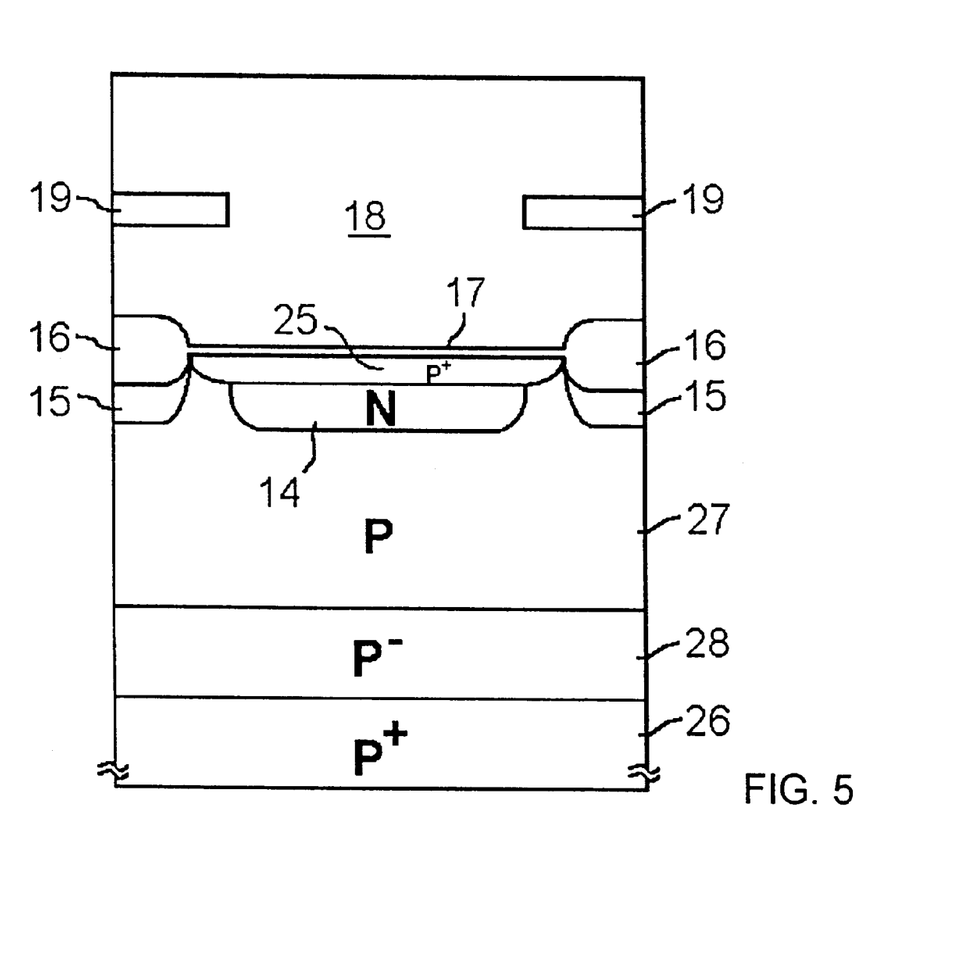
FIG. 5 is a schematic sectional view showing an unit cell in a solid-state imaging device according to a second embodiment of the present invention.

Second Embodiment:

As with the unit cell shown in FIG. 4, the solid-state imaging device according to the second embodiment shown in FIG. 5 is formed as a CMOS image sensor such as the previously described device shown in FIG. 1. Redundant explanation regarding the construction and operation of parts other than the unit cell is accordingly omitted here. In addition, parts in FIG. 5 that are identified by the same reference numerals as used in FIG. 4 are the same constituent elements as the parts in FIG. 4.

The point of difference between this unit cell and the cell shown in FIG. 4 lies in the formation of $p^-$-layer 28 between substrate $p^+$-layer 26 and p-type layer 27. P-layer 28 has an impurity concentration that is lower than that of p-type layer 27, and thus, has an impurity concentration that is considerably lower than that of substrate $p^+$-layer 26. $P^-$-layer 28 corresponds to the low-impurity concentration semiconductor layer of the first conductive type, and is provided on substrate $p^+$-layer 26, preferably by means of epitaxial growth. In addition, the impurity concentration of $p^-$-layer 28 is preferably set lower than the impurity concentration in n-type photoelectric conversion region 14. The impurity concentration of substrate $p^+$-layer 26 is, for example, from $1\times10^{18}$/cm$^3$ to $1\times10^{22}$/cm$^3$; the impurity concentration of $p^-$-layer 28 is, for example, from $1\times10^{14}$/cm$^3$ to $1\times10^{16}$/cm$^3$, and the impurity concentration of p-type layer 27 is, for example, from $1\times10^{16}$/cm$^3$ to $1\times10^{18}$/cm$^3$. The impurity concentration of n-type photoelectric conversion region 14 is, for example, $1\times10^{18}$/cm$^3$ to $1\times10^{22}$/cm$^3$.

In concrete terms, when forming this unit cell, $p^-$-layer 28 and p-type layer 27 can be grown on substrate $p^+$-layer 26 in the same epitaxial step, following which a p-type impurity can be introduced in only the appropriate portions of p-type layer 27 by ion implantation. In this case, the thickness of p-type layer 27 is determined by the maximum range of impurities at the time of ion implantation. Because the thickness of p-type layer 27 in this unit cell is also preferably set to between 2 μm and 10 μm, the ion energy during implantation is adjusted according to the desired thickness. Further, as will be explained hereinbelow, the location of maximum impurity concentration is not at the surface of p-type layer 27 but in the interior, and ion implantation is preferably carried out at a relatively high energy such that the distribution of impurity concentration in the direction of depth, that is, a depth profile, is a retrograde profile.

In this unit cell as well, when incident light enters a photodiode made up by n-type photoelectric conversion region 14 and p-type layer 27, the incident light generates electron-hole pairs in n-type photoelectric conversion region 14 and the region of p-type layer 27 that underlies n-type photoelectric conversion region 14 during a signal charge accumulation period. The generated electrons are thereupon accumulated in a depletion layer that is formed in n-type photoelectric conversion region 14 and the portion of p-type layer 27 that underlies n-type photoelectric conversion region 14. The presence below p-type layer 27 of $p^-$-layer 28 that has a lower impurity concentration than p-type layer 27 at this time results in the tendency for electrons that are generated in p-type layer 27 to diffuse in this p-layer 28, which has a low potential. Because a high-concentration substrate $p^+$-layer is formed, electrons that have once reached $p^-$-layer 28 are reliably captured in substrate $p^+$-layer 26 and then recombined and annihilated before diffusing in a horizontal direction, i.e., in the direction of adjacent unit cells. The unit cell shown in FIG. 5 therefore provides greater suppression of the horizontal diffusion of electrons than the prior art. This unit cell is therefore capable of reducing crosstalk between pixels and suppressing the loss of image resolution.

Figure 6:
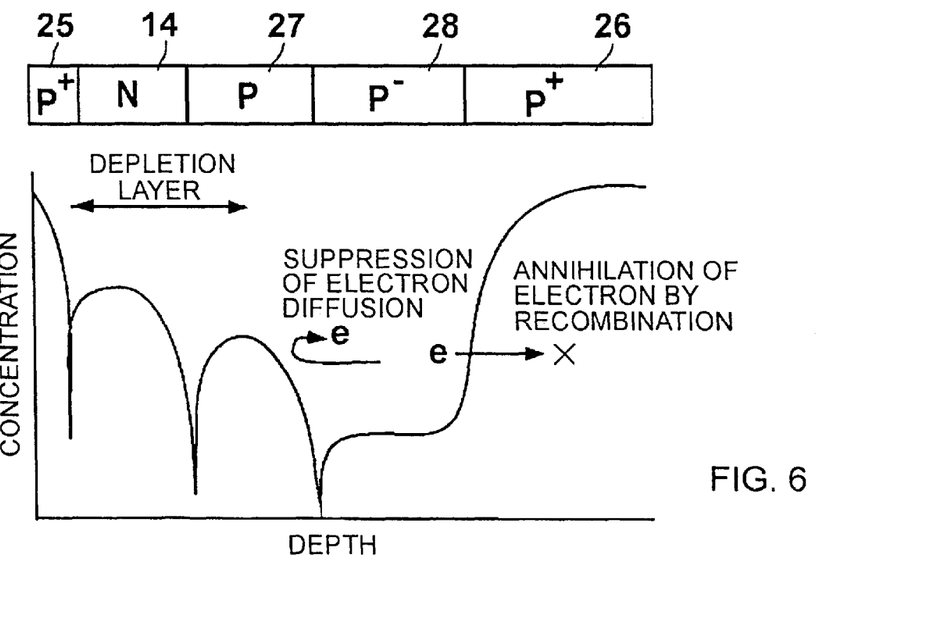
FIG. 6 shows the depth profile of the impurity in a photodiode portion in the solid state imaging device shown in FIG. 5.

For the purpose of explaining the motion of the electrons described above, FIG. 6 shows an impurity concentration profile in the direction of depth of a photodiode of the unit cell shown in FIG. 5. In this case, as described hereinabove, the impurity concentration of substrate $p^+$-layer 26 is high, the concentration in n-type photoelectric conversion region 14 and p-type layer 27 is medium, and the concentration in $p^-$-layer 28 is low. The extent of the photoelectric conversion region which acts as depletion layer is the portion indicated by an arrow, its direction in depth extending from n-type photoelectric conversion region 14 to the middle portion in the direction of depth of p-type layer 27. Photoelectrons that are generated in deeper portions than the middle of p-type layer 27 are effectively diffused in the direction of player 28, and even electrons that do diffuse in the horizontal direction do not again reach the depletion layer on the surface side and do not contribute to sensitivity. In other words, the diffusion of electrons is substantially suppressed. Electrons that reach p-layer 28 are recombined and annihilated in substrate $p^+$-layer 26 and therefore also make no contribution to sensitivity. The diffusion of electrons in the horizontal direction is thus suppressed, and crosstalk between pixels can be reduced.

Figure 7:
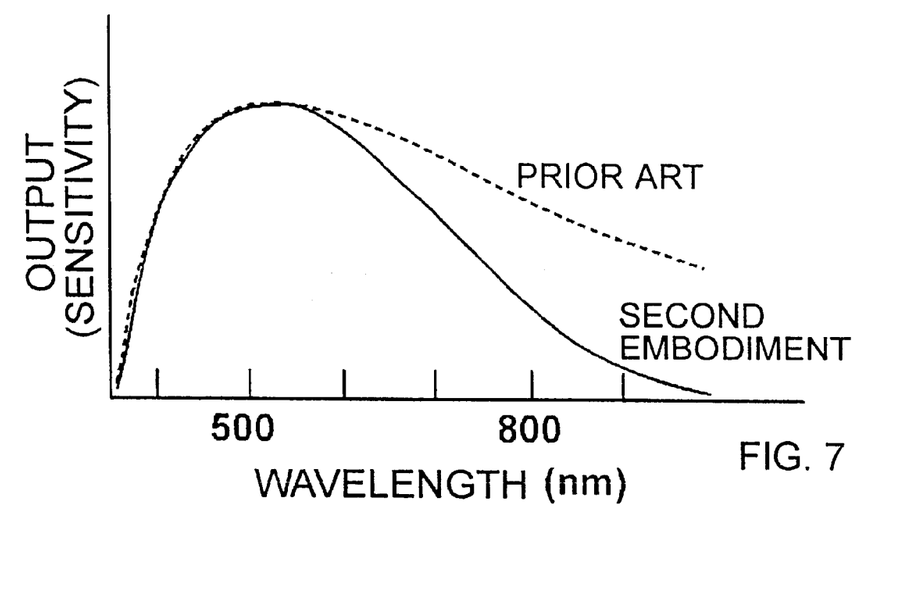
FIG. 7 is a graph showing the spectral sensitivity characteristic in a solid-state imaging device of the prior art and the solid-state imaging device shown in FIG. 5.

The unit cell of the second embodiment further has the advantage of allowing easy control of the spectral characteristic of the photodiode. FIG. 7 is a graph showing the spectral sensitivity of the unit cell of the second embodiment and an unit cell of the prior art.

In the case of the unit cell of the prior art, photoelectrons that occur at deep portion of the photodiode, i.e., at deep locations of p-type well 13, also contribute to sensitivity, and the unit cell therefore exhibits relatively high sensitivity to near-infrared light. As previously explained, not only is sensitivity to near-infrared light not required in a solid-state imaging device for visible light, as a source of deterioration of the crosstalk characteristic, sensitivity to near-infrared light is preferably reduced to a minimum. In the case of the unit cell shown in FIGS. 5 and 6, the determinant of spectral sensitivity, and in particular, sensitivity to the near-infrared portion, is the extension of the depletion layer in the direction of depth, and more specifically, the depth (and profile) of p-type layer 27. Contributions to the sensitivity at portions that are deeper than p-type layer 27 can be reduced by appropriately controlling this position of p-type layer 27, and particularly, the position of the maximum impurity concentration. In the case shown in FIG. 7, controlling only the extension in the direction of depth of p-type layer 27 effectively suppresses only sensitivity to near-infrared light and, compared to the example of the prior art, does not reduce sensitivity to shorter wavelengths of visible light (from 350 nm to 550 nm).

Figure 8:
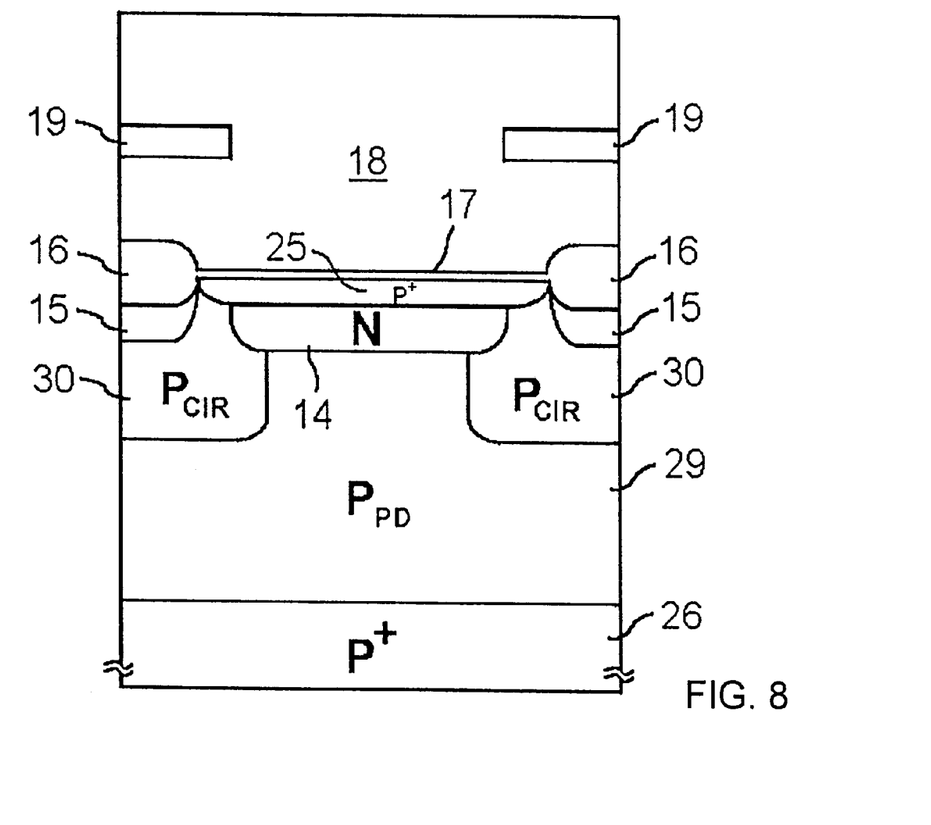
FIG. 8 is a schematic sectional view showing an unit cell in a solid-state imaging device according to a third embodiment of the present invention.

Third Embodiment:

As with the device shown in FIG. 4, the solid-state imaging device according to the third embodiment shown in FIG. 8 is formed as the previously described CMOS image sensor shown in FIG. 1, and redundant explanation of the construction and operation of parts other than the unit cell is therefore omitted. In addition, parts in FIG. 8 bearing the same reference numerals as parts in FIG. 4 are constituent elements equivalent to those in FIG. 4.

The unit cell shown in FIG. 8 is substantially the same as the cell shown in FIG. 4 but differs in that p-type layer 27 in the unit cell shown in FIG. 4 is made up by photodiode p-type layer 29 indicated by $P_{PD}$ and peripheral circuit p-type layer 30 indicated by $P_{CIR}$.

Photodiode p-type layer 29 is provided at least in the region that is directly below n-type photoelectric conversion region 14 so as to contact both n-type photoelectric conversion region 14 and substrate p$^+$-layer 26. Peripheral circuit p-type layer 30 is provided as a well region that is formed in photodiode p-type layer 29 and is provided to constitute transistors in pixels such as transistors of horizontal selection switches and driver transistors. Photodiode p-type layer 29 and peripheral circuit p-type layer 30 correspond to the semiconductor layer of the first conductive type and the peripheral circuit layer of the first conductive type, respectively. Peripheral circuit p-type layer 30 itself does not directly join substrate p$^+$-layer 26. The impurity concentration in photodiode p-type layer 29 is lower than that of substrate p$^+$-layer 26. N-type photoelectric conversion region 14 is formed by ion implantation or n-type impurity diffusion in photodiode p-type layer 29.

The impurity concentration of substrate p$^+$-layer 26 is, for example, $1\times10^{18}/cm^3$ to $1\times10^{22}/cm^3$, and the impurity concentration of photodiode p-type layer 29 and peripheral circuit p-type layer 30 is, for example, $1\times10^{16}/cm^3$ to $1\times10^{18}/cm^3$. However, the impurity concentration of photodiode p-type layer 29 is lower than the impurity concentration of peripheral circuit p-type layer 30. The impurity concentration of n-type photoelectric conversion region 14 is, for example, $1\times10^{18}/cm^3$ to $1\times10^{22}/cm^3$. Photodiode p-type layer 29 and peripheral circuit p-type layer 30 are, for example, grown on substrate p$^+$-layer 26 by epitaxial growth and formed by the desired ion implantation.

In this unit cell as well, when incident light enters the photodiode that is made up by n-type photoelectric conversion region 14 and photodiode p-type layer 29, the incident light generates electron-hole pairs in n-type photoelectric conversion region 14 and the region of photodiode p-type layer 29 that underlies n-type photoelectric conversion region 14 in a signal charge accumulation period. The generated electrons are then accumulated in the depletion layer that is formed in n-type photoelectric conversion region 14 and the portion of photodiode p-type layer 29 that is below n-type photoelectric conversion region 14.

At this time, the arrangement of substrate p$^+$-layer 26 having a higher impurity concentration than photodiode p-type layer 29 below photodiode p-type layer 29 means that, of the photoelectrons that have been generated in photodiode p-type layer 29, electrons that are diffused in the direction of the substrate are reliably captured in substrate p$^+$-layer 26 and then recombined and annihilated. The unit cell shown in FIG. 8 therefore provides greater suppression of horizontal electron diffusion than the unit cell of the prior art. Crosstalk between pixels can therefore be reduced, and decrease in image resolution can be suppressed. Furthermore, this unit cell is capable of providing greater suppression of the diffusion of electrons and reducing crosstalk than the unit cell shown in FIG. 4 because peripheral circuit p-type layer 30 is formed below transistors in the pixels, and the p-type impurity concentration of this layer is higher than that of photodiode p-type layer 29.

Figure 9:
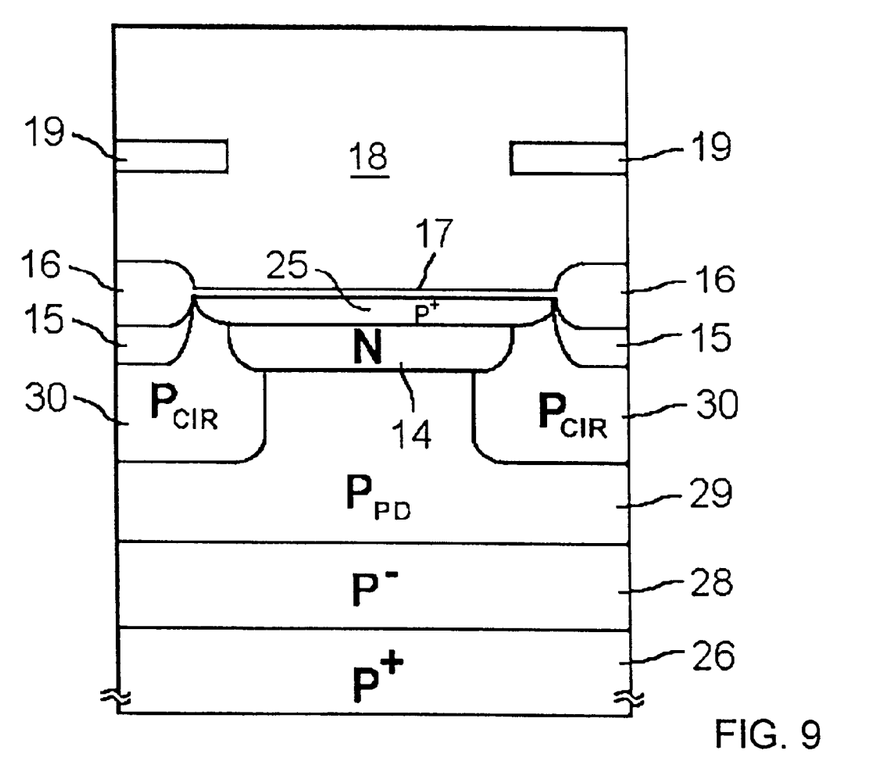
FIG. 9 is a schematic sectional view showing an unit cell in a solid-state imaging device according to a fourth embodiment of the present invention.

Fourth Embodiment:

As with the device shown in FIG. 8, the solid-state imaging device according to the fourth embodiment shown in FIG. 9 is formed as the previously described CMOS image sensor shown in FIG. 1, and redundant explanation regarding the construction and operation of parts other than the unit cell is here omitted. In addition, parts in FIG. 9 bearing the same reference numerals as parts in FIG. 8 are the same constituent elements as the parts in FIG. 8.

The difference between this unit cell and the cell shown in FIG. 8 is the formation of p-layer 28 having a lower impurity concentration than photodiode p-type layer 29 between substrate p$^+$-layer 26 and photodiode p-type layer 29, as in the second embodiment. P$^-$-layer 28 is provided on substrate p$^+$-layer 26, preferably by epitaxial growth. In the case of the present embodiment, p-layer 28, photodiode p-type layer 29, and peripheral circuit p-type layer 30 can be formed in the same epitaxial step and p-type impurities can be introduced into only appropriate parts of photodiode p-type layer 29 and peripheral circuit p-type layer 30 by ion implantation, as in the second embodiment. In addition, the preferable impurity profile for photodiode p-type layer 29 is the same as the impurity profile of p-type layer 27 in the second embodiment. Here, the impurity concentration of substrate p$^+$-layer 26 is, for example, $1\times10^{18}/cm^3$ to $1\times10^{22}/cm^3$; the impurity concentration of p$^-$-layer 28 is, for example, $1\times10^{14}/cm^3$ to $1\times10^{16}/cm^3$; and the impurity concentration of photodiode p-type layer 29 and peripheral circuit p-type layer 30 is, for example, $1\times10^{16}/cm^3$ to $1\times10^{18}/cm^3$. The impurity concentration of photodiode p-type layer 29, however, is lower than that of peripheral circuit p-type layer 30. The impurity concentration of n-type photoelectric conversion region 14 is, for example, $1\times10^{18}/cm^3$ to $1\times10^{22}/cm^3$.

In this unit cell as well, when incident light enters a photodiode that is made up by n-type photoelectric conversion region 14 and photodiode p-type layer 29, the incident light generates electron-hole pairs in n-type photoelectric conversion region 14 and the region of photodiode p-type layer 29 that underlies n-type photoelectric conversion region 14 during the signal charge accumulation period. The generated electrons are accumulated in the depletion layer that is formed in n-type photoelectric conversion region 14 and the region of photodiode p-type layer 29 that underlies n-type photoelectric conversion region 14. At this time, the presence of p$^-$-layer 28 having a lower impurity concentration than photodiode p-type layer 29 below photodiode p-type layer 29 causes electrons that have been generated in photodiode p-type layer 29 to tend to diffuse in this lower-potential p$^-$-layer 28. Because high-concentration substrate p$^+$-layer 26 has been formed, electrons that have once reached p$^-$-layer 28 are then reliably captured in substrate p$^+$-layer 26, recombined, and annihilated before diffusing in a horizontal direction, i.e., in the direction of adjacent unit cells. The unit cell shown in FIG. 9 is thus capable of providing greater suppression of the horizontal diffusion of electrons than the prior-art unit cell. As a result, this unit cell is capable of reducing crosstalk between pixels and suppressing decrease in image resolution. Furthermore, because peripheral circuit p-type layer 30 is formed below transistors in pixels and because the p-type impurity concentration of this layer is higher than that of photodiode p-type layer 29, this unit cell can provide greater suppression of electron diffusion and keep crosstalk to a lower level than an unit cell of the second embodiment.

Although preferred embodiments of the present invention have been described in the foregoing explanations, the junction position of substrate $p^+$-layer 26 with p-type layer 27 or photodiode p-type layer 30 in these embodiments is preferably not too shallow or sensitivity will be reduced and transistor characteristics altered. The junction position is preferably approximately from 2 $\mu$m to 10 $\mu$m, which is deeper than the p-type well of the prior art. In other words, the thickness of p-type layer 27 or photodiode p-type layer 30 is preferably from 2 $\mu$m to 10 $\mu$m, which includes the thickness of n-type photoelectric conversion region 14 and surface $p^+$-layer 25.

Substrate $p^+$-layer 26 itself can be formed on some type of silicon semiconductor substrate by epitaxial growth. The use of such a substrate $p^+$-layer that has been produced by epitaxial growth has the advantages of reducing flaws and eliminating noise. In this case, the substrate may have any impurity concentration at portions that are deeper than this substrate $p^+$-layer, and the above-described object can be realized by using this p-on-$p^+$-substrate.

Although a low-noise "pinned" photodiode having surface $p^+$-layer 25 on the photodiode surface was described in the above-described embodiments, the invention is not limited to this photodiode structure and obviously may be applied to a photodiode that lacks surface $p^+$-layer 25 on the photodiode surface.

Furthermore, the present invention is not limited to the above-described CMOS image sensor and can obviously be applied to a one-dimensional CMOS sensor (i.e., "line sensor") or photocoupler having a photodiode structure. In addition, the present invention includes within its scope a construction in which the conductive type of each layer is reversed in the above-described embodiments, for example, a construction that uses a substrate $n^+$-layer, an n-type layer, and a p-type photoelectric conversion region in place of a substrate $p^+$-layer, a p-type layer, and a n-type photoelectric conversion region and in which holes are accumulated in a depletion layer.

As described in the foregoing explanation, in the solid-state imaging device of the present invention, a high-concentration substrate layer of the first conductive type, which is a substrate $p^+$-layer, is formed below a semiconductor layer of a first conductive type such as a p-type layer or a photodiode p-type layer. As a result, of the photoelectrons that are generated within the semiconductor layer, those electrons that diffuse toward the substrate are reliably captured in the substrate layer and then recombined and annihilated. The horizontal diffusion of electrons is therefore more effectively suppressed than in devices of the prior art, and crosstalk between pixels can be further reduced, enabling a suppression of loss in image resolution.

In addition, in a construction that is provided with a low-impurity concentration semiconductor layer of the first conductive type, which is, for example, a $p^-$-layer, electrons that are generated in the semiconductor layer tend to diffuse toward the low-impurity concentration semiconductor layer, which has low potential. Electrons that reach the low-impurity concentration semiconductor layer are reliably captured in the substrate layer and then recombined and annihilated before being dispersed in a horizontal direction. The device of the present invention therefore provides greater suppression of horizontal electron diffusion than a device of the prior art and thus enables a further reduction of crosstalk between pixels, and consequently, can suppress loss in image resolution. In this case, moreover, controlling the distribution of impurity in the direction of depth in the semiconductor layer enables effective suppression of only near-infrared light without reducing sensitivity to shorter wavelengths (from 350 nm to 550 nm) of visible light. In conclusion, a solid-state imaging device can be obtained that is amenable to use as a device for visible light.

While preferred embodiments of the present invention have been described using specific terms, such description is for illustrative purposes only, and it is to be understood that changes and variations may be made without departing from the spirit or scope of the following claims.

What is claimed is:

1. A solid-state imaging device, comprising:
    a substrate layer which is composed of a semiconductor of a first conductive type;
    a semiconductor layer of said first conductive type which is provided on said substrate layer;
    a photoelectric conversion region of a second conductive type, which is an opposite conductive type of said first conductive type, provided on said semiconductor layer; and
    a surface layer of said first conductive type which is provided on said photoelectric conversion region;
    wherein impurity concentrations of said substrate layer and said surface layer are higher than an impurity concentration of said semiconductor layer, and
    wherein a depth profile of impurity in said semiconductor layer is a retrograde profile that decreases away from a PN junction.

2. A solid-state imaging device according to claim 1, further comprising a peripheral circuit semiconductor layer of the first conductive type which is formed on said semiconductor layer at least below transistors in pixels, impurity concentration of the peripheral circuit semiconductor layer being higher than the impurity concentration of said semiconductor layer.

3. The solid-state imaging device according to claim 2, wherein said peripheral circuit semiconductor layer directly contacts said photoelectric conversion region.

4. The solid-state imaging device according to claim 3, wherein said peripheral circuit semiconductor layer directly contacts said surface layer.

5. A solid-state imaging device according to claim 1, wherein distance from a surface of a semiconductor main plane to a surface on the substrate layer side of said semiconductor layer is a minimum of 2 $\mu$m and a maximum of 10 $\mu$m.

6. A solid-state imaging device, comprising:
    a substrate layer which is composed of a semiconductor of a first conductive type;
    a low-impurity concentration semiconductor layer of said first conductive type which is provided directly on said substrate layer;
    a semiconductor layer of said first conductive type which is provided directly on said low-impurity concentration semiconductor layer; and
    a photoelectric conversion region of a second conductive type, which is an opposite conductive type of said first conductive type, provided directly on said semiconductor layer;
    wherein impurity concentration of said substrate layer is higher than impurity concentration of said semiconductor layer, and impurity concentration of said low-impurity density semiconductor layer is lower than the impurity concentration of said semiconductor layer.

7. A solid-state imaging device according to claim 6, wherein the impurity concentration of said low-impurity density semiconductor layer is lower than impurity concentration of said photoelectric conversion region.

8. A solid-state imaging device according to claim 6, wherein at least one of said semiconductor layer and said low-impurity density semiconductor layer is formed by epitaxial growth.

9. A solid-state imaging device according to claim 6, further comprising a peripheral circuit semiconductor layer of the first conductive type that is formed on said semiconductor layer at least below transistors in pixels, impurity concentration of the peripheral circuit semiconductor layer being higher than the impurity concentration of said semiconductor layer.

10. A solid-state imaging device according to claim 6, wherein a depth profile of impurity in said semiconductor layer is a retrograde profile that decreases away from a PN junction.

11. A solid-state imaging device according to claim 6, wherein distance from a surface of a semiconductor main plane to a surface on the substrate layer side of said semiconductor layer is a minimum of 2 $\mu$m and a maximum of 10 $\mu$m.

* * * * *